(12) United States Patent
Hur

(10) Patent No.: US 6,545,531 B1
(45) Date of Patent: Apr. 8, 2003

(54) POWER VOLTAGE DRIVER CIRCUIT FOR LOW POWER OPERATION MODE

(75) Inventor: Young Do Hur, Chungcheongbuk-do (KR)

(73) Assignee: Hynix Semiconductor Inc., Ich'on (KR)

( * ) Notice: Subject to any disclaimer, the term of this patent is extended or adjusted under 35 U.S.C. 154(b) by 0 days.

(21) Appl. No.: 10/028,693

(22) Filed: Dec. 28, 2001

(30) Foreign Application Priority Data

Sep. 20, 2001 (KR) .................................... 2001-0058149

(51) Int. Cl.[7] ................................................. G05F 1/10
(52) U.S. Cl. ......................................... 327/544; 327/545
(58) Field of Search ................................. 327/544, 545, 327/108, 538, 540, 77

(56) References Cited

U.S. PATENT DOCUMENTS

| 5,838,177 | A |   | 11/1998 | Keeth |         |
|-----------|---|---|---------|-------|---------|
| 5,973,549 | A | * | 10/1999 | Yuh   | 327/544 |
| 6,008,632 | A | * | 12/1999 | Sasaki| 327/544 |
| 6,069,504 | A |   | 5/2000  | Keeth |         |
| 6,198,674 | B1|   | 3/2001  | Kim   |         |
| 6,215,837 | B1|   | 4/2001  | Yi    |         |
| 6,218,893 | B1| * | 4/2001  | Noguchi | 327/544 |
| 6,388,695 | B1| * | 5/2002  | Nagumo | 327/544 |

FOREIGN PATENT DOCUMENTS

| JP | 10-324077 | 12/1998 | ........... B42C/17/00 |
| JP | 11-30639  | 2/1999  | ........... G01R/31/02 |
| JP | 11-121656 | 4/1999  | ........... H01L/23/28 |

* cited by examiner

*Primary Examiner*—Toan Tran
(74) *Attorney, Agent, or Firm*—Jacobson Holman PLLC

(57) ABSTRACT

A power voltage driver circuit includes: a constant voltage generating unit for generating a first constant voltage and a second constant voltage; a clock input buffer unit using an internal step-down voltage as a power source; a control unit for receiving an operation control signal indicating the low power operation mode; a voltage comparing unit controlled in response to the output signal from the control unit, for stopping the operation in the low power operation mode, and receiving the first and second constant voltages in the other operation modes, and generating a signal by comparing and amplifying the first and second constant voltages with a reference voltage; and a driver unit controlled in response to the output signal from the control unit.

13 Claims, 5 Drawing Sheets

US 6,545,531 B1

POWER VOLTAGE DRIVER CIRCUIT FOR LOW POWER OPERATION MODE

BACKGROUND OF THE INVENTION

1. Field of the Invention

The present invention relates to a power voltage driver circuit for a low power operation mode in a semiconductor memory device, and in particular to an improved power voltage driver circuit for a low power operation mode which can be stably operated, reducing power consumption in the low power operation mode.

2. Description of the Background Art

FIG. 1 is a circuit diagram illustrating a conventional power voltage driver circuit including a voltage comparing unit 1 and a driver unit 2. Referring to FIG. 1, an output signal VDLI from the voltage comparing unit 1 is transmitted as a power supply source of a clock input buffer for a memory operation. An input signal VLR of the voltage comparing unit 1 is generated in a constant voltage generating unit, and the voltage level of the input signal VLR maintains half an output signal VDLI/2 regardless of variations of an external power voltage VDD. In addition, an input signal VLNG of the voltage comparing unit 1 is generated in the constant voltage generating unit, and maintains a threshold voltage value Vtn of an NMOS transistor regardless of variations of the external power voltage VDD.

As illustrated in FIG. 1, the voltage comparing unit 1 and the driver unit 2 are formed as a type of current mirror, and include: PMOS transistors P1 and P2 for constantly supplying the power voltage VDD to nodes Nd1 and Nd2; NMOS transistors N1 and N2 for receiving the input signal VLR and a signal of a node Nd5, and determining the potentials at the nodes Nd1 and Nd2 in response to a magnitude of the signals; an NMOS transistor N3 for discharging a current transmitted to a node Nd3 through the NMOS transistors N1 and N2 to a ground voltage Vss in response to the input signal VLNG; a PMOS transistor P3 for transmitting the power voltage VDD to an output terminal Nd4 in response to the signal of the node Nd1; a PMOS transistor P4 for transmitting the signal of the output terminal node Nd4 to the node Nd5 in response to the signal of the node Nd5; and a PMOS transistor P5 connected in a diode structure between the node Nd5 and the ground voltage Vss.

When the power voltage driver circuit receives the input signals VLR and VLNG from the constant voltage generating unit, the power voltage driver circuit outputs the signal VDLI obtained by stepping down the power voltage VDD to the output terminal Nd4 through the driver unit 2 by the voltage comparing unit 1 comparing and outputting the input signal VLR and the reference voltage Nd5.

FIG. 2 is a timing diagram for entrance to a deep power down (DPD) mode in a conventional semiconductor memory device, showing a precharge entrance period (a) and a DPD mode entrance period (b).

FIG. 3 is a timing diagram for extrication from the DPD mode showing a DPD mode extrication period (c), a mode bank precharge entrance period (d) and an auto refresh entrance period (e).

The conventional semiconductor memory device uses the DPD mode to reduce power consumption during non-operation. As shown in FIG. 2, when input pins of a clock signal CKE, a chip selector signal /CS, a RAS bar signal /RAS, a CAS bar signal /CAS and a write enable signal /WE are in low, low, high, high and low states, respectively, the semiconductor memory device enters into the DPD mode. When entering into the DPD mode, the semiconductor memory device maintains a lower power state than when in a standby mode. In order to extricate from the DPD mode, the clock signal CKE needs to transition from a low to high state, as shown in FIG. 3.

The clock input buffer monitoring the state of the clock signal CKE must be operated in the DPD mode to extricate from the DPD mode.

FIG. 4 is a block diagram illustrating the conventional power voltage driver circuit and clock input buffer. There are shown an internal step-down power driver circuit unit 10 having the voltage comparing unit 1 and the driver unit 2, a constant voltage generating unit 3, a clock input buffer unit 4 and a data output driver unit 5.

The constant voltage generating unit 3 receives the external power voltage VDD and the ground voltage VSS, and generates constant voltages VLR and VLNG to be used as the input signals of the voltage comparing unit 1.

The voltage comparing unit 1 receives the external power voltage VDD and the ground voltage VSS, and generates a signal ENB obtained by comparing and amplifying the constant voltages VLR and VLNG from the constant voltage generating unit 3.

The driver unit 2 generates the internal step-down voltage VDLI by using the external power voltage VDD according to the output signal ENB from the voltage comparing unit 1.

The clock input buffer unit 4 is operated according to the external clock CKE by using the internal step-down voltage VDLI generated in the driver unit 2.

In FIG. 4, an external power voltage VDDQ used as a power source of the data output driver unit 5 has a lower potential value than the external power voltage VDD.

However, the conventional power voltage driver circuit has a disadvantage in that the clock input buffer unit 4 uses the internal power voltage VDLI generated in the internal step-down power driver circuit 10 as a power voltage, and thus the driver unit 2 must be operated even in a low power mode to operate the clock input buffer unit 4. That is, the driver unit 2 is operated in the low power DPD mode, thereby increasing power consumption.

SUMMARY OF THE INVENTION

Accordingly, it is an object of the present invention to provide a power voltage driver circuit for a low power operation mode which can be stably operated, reducing power consumption in the low power operation mode.

In order to achieve the above-described object of the invention, there is provided a power voltage driver circuit for a low power operation mode in a semiconductor memory device, including: a constant voltage generating unit for generating a first constant voltage and a second constant voltage; a clock input buffer unit using an internal step-down voltage as a power source; a control unit for receiving an operation control signal indicating the low power operation mode; a voltage comparing unit controlled in response to the output signal from the control unit, for stopping the operation in the low power operation mode, and receiving the first and second constant voltages in the other operation modes, and generating a signal by comparing and amplifying the first and second constant voltages with a reference voltage; and a driver unit controlled according to the output signal from the control unit and the output signal from the voltage comparing unit, for generating the internal step-down voltage by using a first external power voltage in the other operation modes, and by using a second external power voltage in the low power operation mode.

The second external power voltage has a lower potential value than the first external power voltage.

The first constant voltage maintains half an internal step-down voltage regardless of variations of the first external power voltage, and the second constant voltage maintains a threshold voltage value of an NMOS transistor regardless of variations of the first external power voltage.

The control unit includes one inverter.

The voltage comparing unit includes: a differential amplifying unit operated in response to the second constant voltage, for comparing the first constant voltage with the reference voltage, and outputting an amplified signal; and an output unit having first to fourth MOS transistors connected in series between an output terminal generating the internal step-down voltage and a ground voltage. The first and fourth MOS transistors have a diode structure, the second and third MOS transistors are controlled in response to the output signal from the control unit, and the reference voltage is outputted from a node between the second and third MOS transistors.

The first and fourth MOS transistors are PMOS transistors, and the second and third MOS transistors are NMOS transistors.

The driver unit includes: a fifth MOS transistor for supplying the first external power voltage to an output node of the differential amplifying unit in response to the output signal from the control unit; a sixth MOS transistor for supplying the second external power voltage to the output terminal outputting the internal step-down voltage in response to the output signal from the control unit; and a seventh NMOS transistor for supplying the first external power voltage to the output terminal outputting the internal step-down voltage in response to the signal of the output node of the differential amplifying unit.

The fifth to seventh MOS transistors are PMOS transistors.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
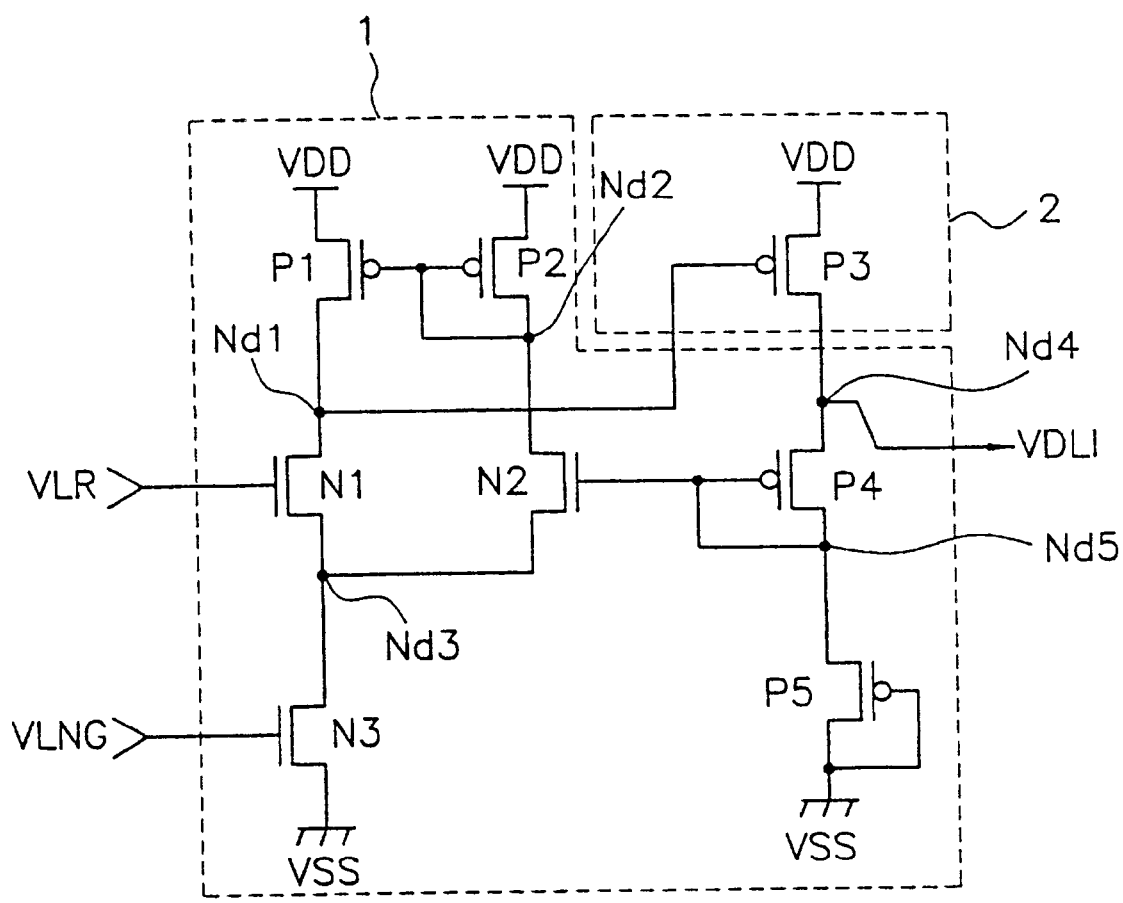
FIG. 1 is a circuit diagram illustrating a conventional power voltage driver circuit.
Figure 2:
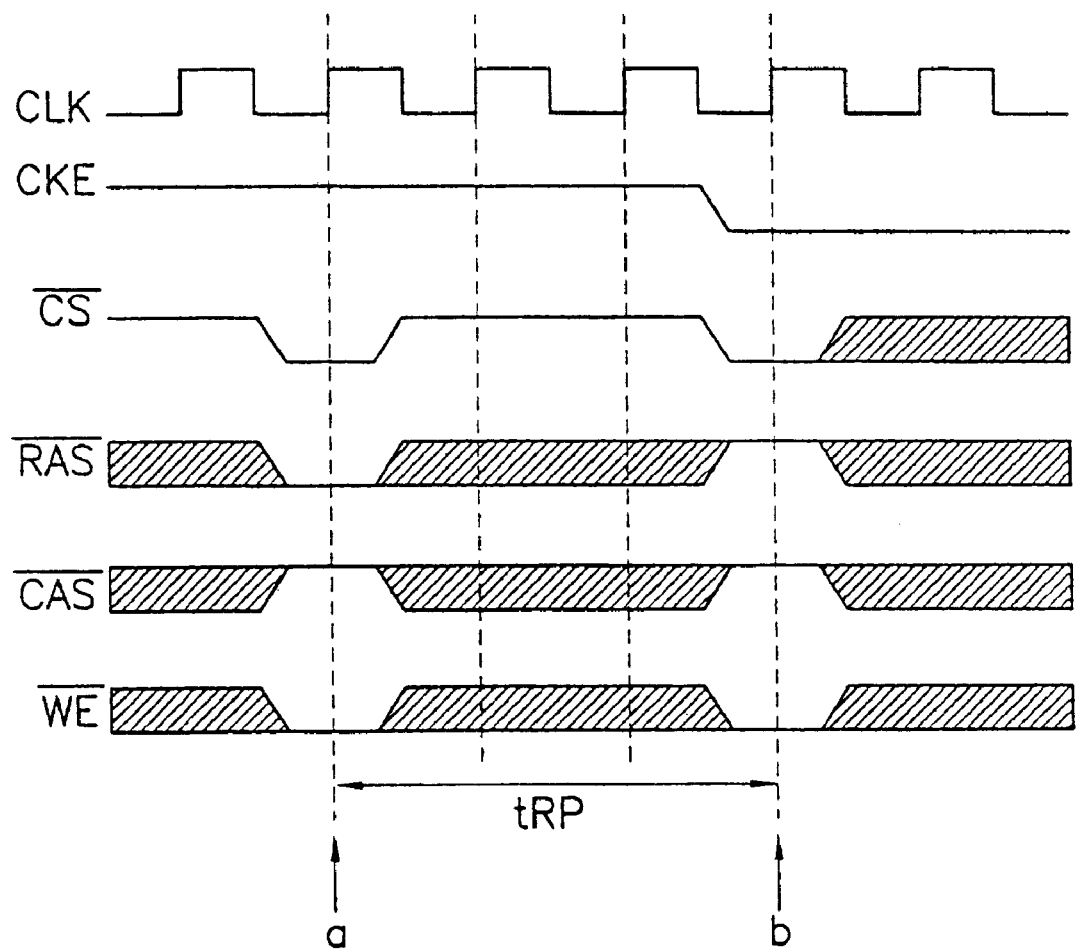
FIG. 2 is a timing diagram for entrance to a deep power down mode.
Figure 3:
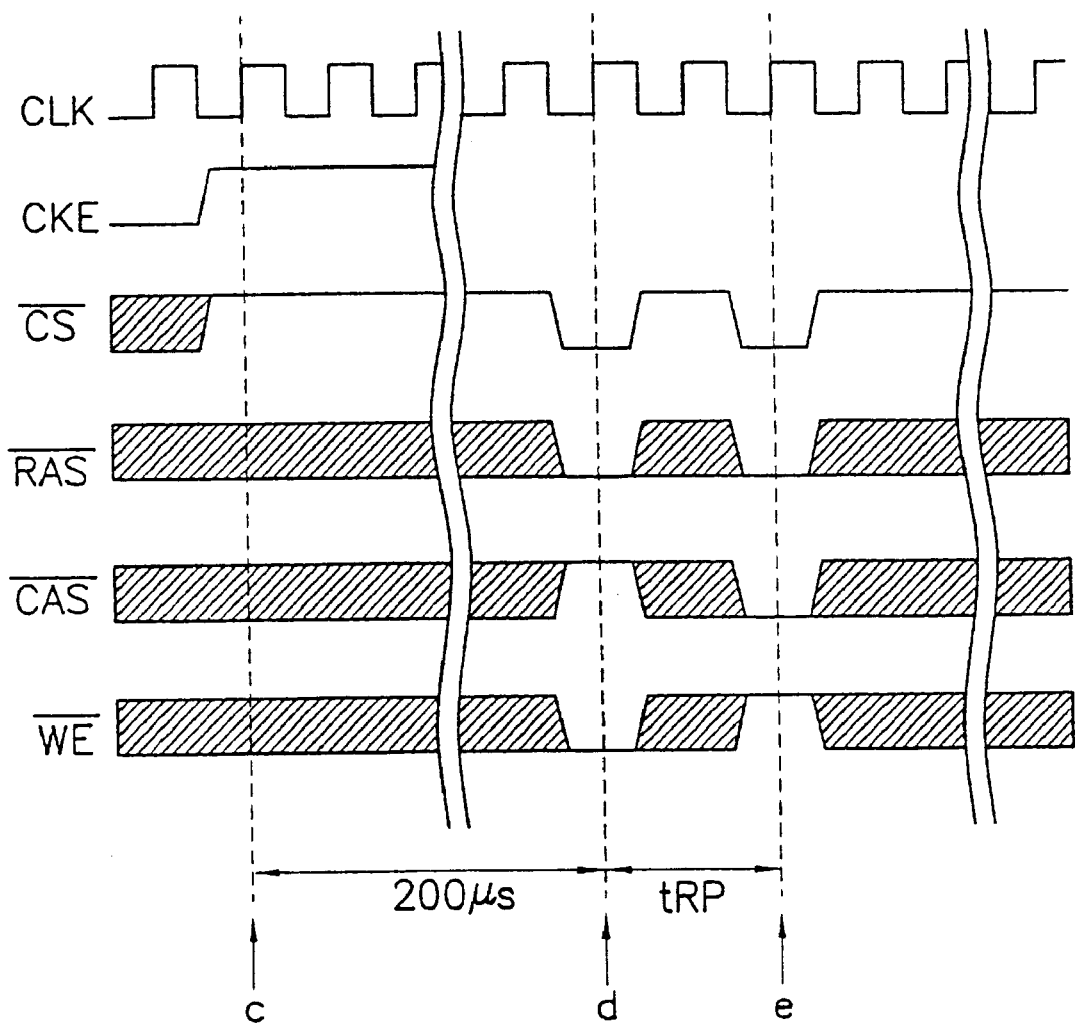
FIG. 3 is a timing diagram for extrication from the deep power down mode.
Figure 4:
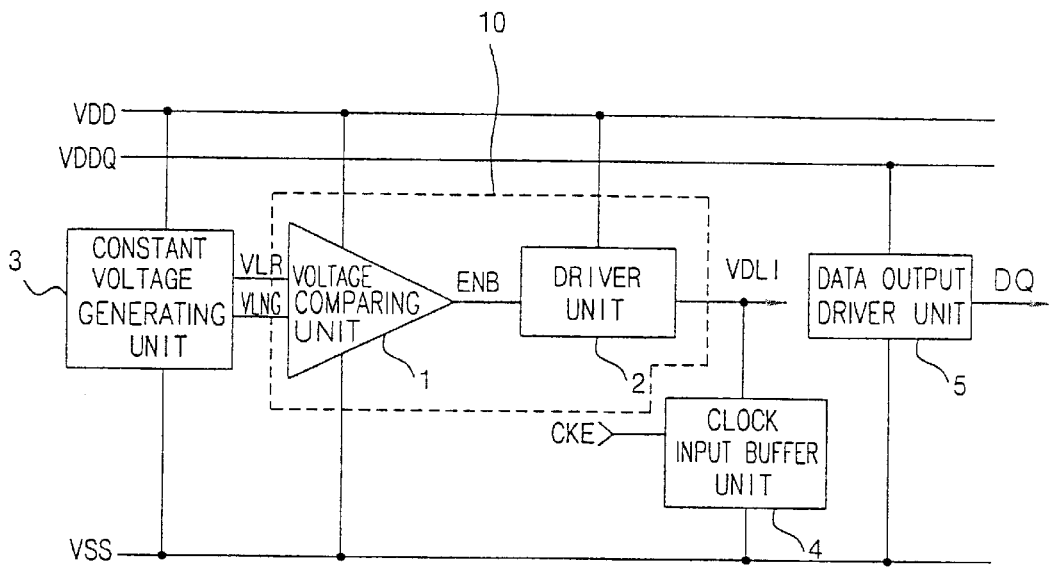
FIG. 4 is a block diagram illustrating the conventional power voltage driver circuit and clock input buffer.

A power voltage driver circuit for a low power operation mode in accordance with a preferred embodiment of the present invention will now be described in detail with reference to the accompanying drawings.

In the following description, the same drawing reference numerals are used for the same elements even in different drawings, and explanations thereof will be omitted.

Figure 5:
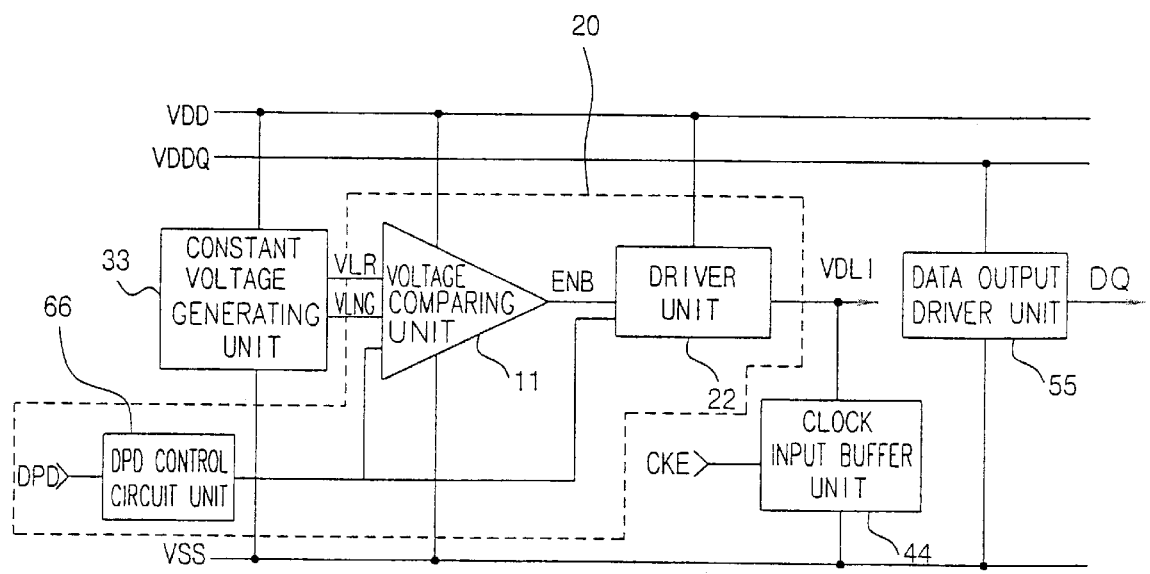
FIG. 5 is a block diagram illustrating a power voltage driver circuit for a low power operation mode and a clock input buffer in accordance with the present invention.

FIG. 5 is a block diagram illustrating the power voltage driver circuit for the low power operation mode in accordance with the present invention. The power voltage driver circuit for the low power operation mode includes an internal step-down power driver circuit unit 20 having a voltage comparing unit 11, a driver unit 22 and a DPD control circuit unit 66, a constant voltage generating unit 33, a clock input buffer unit 44 and a data output driver unit 55.

The constant voltage generating unit 33 receives an external power voltage VDD and a ground voltage VSS, and generates constant voltages VLR and VLNG to be used as input signals of the voltage comparing unit 11.

The DPD control circuit unit 66 receives a DPD signal having a high level in the DPD mode, and outputs an inverted signal.

The voltage comparing unit 11 receives the external power voltage VDD and the ground voltage VSS. When the output signal from the DPD control circuit unit 66 has a high level (not in the DPD mode), the voltage comparing unit 11 generates a signal ENB by comparing and amplifying the constant voltages VLR and VLNG and a reference voltage. When the output signal from the DPD control circuit unit 66 has a low level (in the DPD mode), the voltage comparing unit 11 is not operated due to interception of a current path between the external power voltage VDD and the ground voltage VSS.

When the output signal from the DPD control circuit unit 66 has a high level (not in the DPD mode), the driver unit 22 generates a first internal step-down voltage VDLI to an output terminal node Nd15 (shown in FIG. 6) by using the external power voltage VDD in response to the output signal ENB from the voltage comparing unit 11. When the output signal from the DPD control circuit unit 66 has a low level (in the DPD mode), the driver unit 22 generates a second internal step-down voltage VDLI to the output terminal node Nd15 by using an external power voltage VDDQ. Here, the external power voltage VDDQ has a lower potential value than the external power voltage VDD. The second internal step-down voltage VDLI generated by the external power voltage VDDQ has a lower potential value than the first internal step-down voltage VDLI generated by the external power voltage VDD.

The clock input buffer unit 44 receiving an external clock CKE uses the first internal step-down voltage from the driver unit 22 as a power source in the other modes, and uses the second internal step-down voltage VDLI from the driver unit 22 as a power source in the DPD mode.

Figure 6:
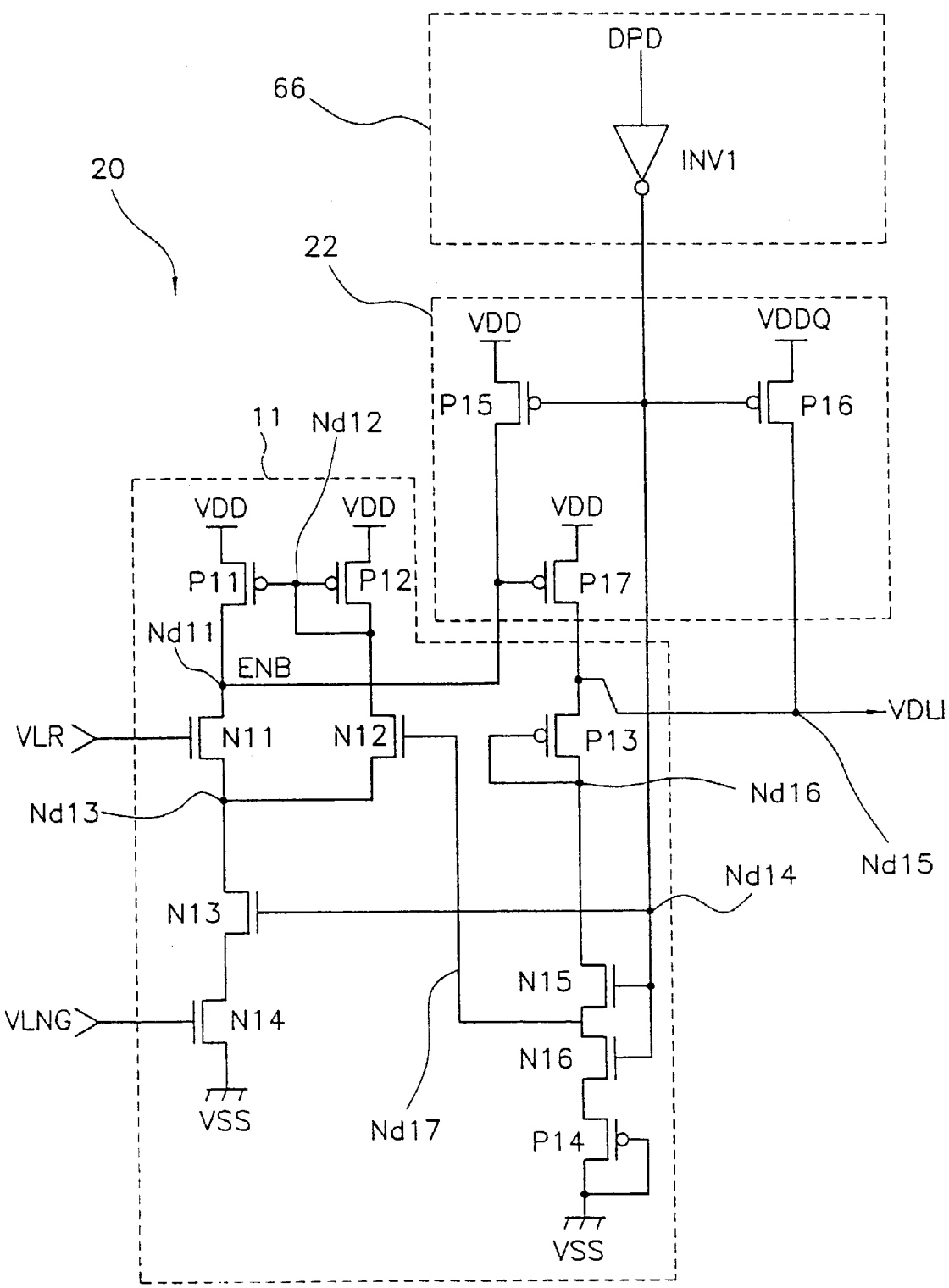
FIG. 6 is a circuit diagram illustrating the power voltage driver circuit for the low power operation mode in accordance with the present invention.

FIG. 6 is a circuit diagram illustrating the power voltage driver circuit for the low power operation mode in accordance with the present invention, including the voltage comparing unit 11, the driver unit 22 and the DPD control circuit unit 66. Referring to FIG. 6, the output signal VDLI from the voltage comparing unit 11 is transmitted as a power source of the clock input buffer for memory operation. The input signal VLR of the voltage comparing unit 11 is generated from the constant voltage generating unit, and the voltage level of the input signal VLR maintains half an output signal VDLI/2 regardless of variations of the external power voltage VDD. The input signal VLNG of the voltage comparing unit 11 is also generated from the constant voltage generating unit, and maintains a threshold voltage value Vtn of an NMOS transistor regardless of variations of the external power voltage VDD.

As illustrated in FIG. 6, the voltage comparing unit 11, the driver unit 22 and the DPD control circuit unit 66 are formed as a type of current mirror, and include: PMOS transistors P11 and P12 for constantly supplying the power voltage VDD to nodes Nd11 and Nd12; NMOS transistors N11 and N12 for receiving the input signal VLR and a signal of a node Nd17, and transmitting the current of the nodes Nd11 and Nd12 to a node Nd13 in response to a magnitude of the signals; and NMOS transistors N13 and N14 connected in series between the node Nd13 and the ground voltage, for discharging the current transmitted to the node Nd13 through the NMOS transistors N11 and N12 to the ground voltage, when the signal of the node Nd14 and the input signal VLNG have a high level. In addition, the voltage comparing unit 11, the driver unit 22 and the DPD control circuit unit 66 further include: an inverter INV1 for receiving the DPD signal having a high level in the DPD mode, and generating an inverted signal to the node Nd14; a PMOS transistor P15 for transmitting the external power voltage VDD to the node Nd11 when the signal of the node Nd14 has a low level; a PMOS transistor P17 for transmitting the external power voltage VDD to the output terminal Nd15 when the signal of the node Nd11 has a low level; a PMOS transistor P16 for transmitting the external power voltage VDDLQ to the output terminal Nd15 when the signal of the node Nd14 has a low level; a PMOS transistor P13 connected in a diode structure between the output terminal Nd15 and a node Nd16; an NMOS transistor N15 connected between the node Nd16 and a node Nd17, and controlled by the node Nd14; and an NMOS transistor N16 and a PMOS transistor P14 serially connected in a diode structure between the node Nd17 and the ground voltage Vss, and controlled by the node Nd14.

The DPD control circuit unit 66 having the inverter INV1 receives the DPD signal, and outputs the inverted signal to the node Nd14. The node Nd14 has a low state in the DPD mode where the DPD signal has a high level, and has a high state in the other modes.

Firstly, since the signal of the node Nd14 has a low state in the DPD mode, the NMOS transistors N13, N15 and N16 of the voltage comparing unit 11 are turned off, and the PMOS transistor P15 of the driver unit 22 is turned on, thereby turning off the PMOS transistor P17 supplying the external power voltage VDD to the output terminal Nd15. Therefore, the voltage comparing unit 11 is not operated in the DPD mode by intercepting a current path between the external power voltage VDD and the ground voltage VSS.

In addition, the PMOS transistor P16 of the driver unit 22 is turned on in the DPD mode, for supplying the external power voltage VDDQ to the output terminal Nd15. Accordingly, the clock input buffer unit 44 using the internal step-down voltage VDLI generated in the internal step-down power driver circuit unit 20 as a power source is operated in the DPD mode, thereby monitoring extrication from the DPD mode.

In the low power semiconductor memory device, the potential of the external power voltage VDDQ has a lower potential value than that of the external power voltage VDD. It is thus possible to drive the clock input buffer unit 44 with a potential value approximate to the internal step-down voltage VDLI.

Conversely, since the signal of the node Nd14 has a high state in the other operation modes, the NMOS transistors N13, N15 and N16 are turned on, the voltage comparing unit 11 is operated, and thus the PMOS transistor P17 of the driver unit 22 is driven, thereby supplying the external power voltage VDD to the output terminal Nd15. Here, the PMOS transistors P15 and P16 of the driver unit 22 are turned off in the DPD mode. Therefore, the internal step-down power driver circuit unit 20 is normally operated in the other operation modes, to generate the internal step-down voltage VDLI.

As discussed earlier, in accordance with the present invention, the power voltage driver circuit for the low power operation mode controls the operation of the voltage comparing unit 11 and generates the external power voltage VDDQ as the internal step-down voltage VDLI with the driver unit 22 in the low power operation mode such as the DPD mode, and performs a normal operation in the other modes, which results in reduced power consumption. Moreover, the power voltage driver circuit can be stably operated in the low power operation mode.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are intended to be embraced by the appended claims.

What is claimed is:

1. A power voltage driver circuit for a low power operation mode in a semiconductor memory device, comprising:

a constant voltage generating unit for generating a first constant voltage and a second constant voltage;

a clock input buffer unit using an internal step-down voltage as a power source;

a control unit for receiving an operation control signal indicating the low power operation mode;

a voltage comparing unit controlled in response to the output signal from the control unit, for stopping the operation in the low power operation mode, and receiving the first and second constant voltages in the other operation modes, and generating a signal by comparing and amplifying the first and second constant voltages with a reference voltage; and a driver unit controlled in response to the output signal from the control unit and the output signal from the voltage comparing unit, for generating the internal step-down voltage by using a first external power voltage in the other operation modes, and by using a second external power voltage in the low power operation mode.

2. The circuit according to claim 1, wherein the second external power voltage has a lower potential value than the first external power voltage.

3. The circuit according to claim 1, wherein the first constant voltage maintains half an internal step-down voltage regardless of variations of the first external power voltage, and the second constant voltage maintains a threshold voltage value of an NMOS transistor regardless of variations of the first external power voltage.

4. The circuit according to claim 1, wherein the control unit comprises one inverter.

5. The circuit according to claim 4, wherein the voltage comparing unit comprises:

a differential amplifying unit operated in response to the second constant voltage, for comparing the first constant voltage with the reference voltage, and outputting an amplified signal; and an output unit having first to fourth MOS transistors connected in series between an output terminal generating the internal step-down voltage and a ground voltage, wherein the first and fourth MOS transistors have a diode structure, the second and third MOS transistors are controlled in response to the output signal from the control unit, and the reference voltage is outputted from a node between the second and third MOS transistors.

6. The circuit according to claim 5, wherein the first MOS transistor is a PMOS transistor.

7. The circuit according to claim 5, wherein the second MOS transistor is an NMOS transistor.

8. The circuit according to claim 5, wherein the third MOS transistor is an NMOS transistor.

9. The circuit according to claim 5, wherein the fourth MOS transistor is a PMOS transistor.

10. The circuit according to claim 5, wherein the driver unit comprises:

a fifth MOS transistor for supplying the first external power voltage to an output node of the differential amplifying unit in response to the output signal from the control unit;

a sixth MOS transistor for supplying the second external power voltage to the output terminal outputting the internal step-down voltage in response to the signal of the output node of the control unit; and a seventh NMOS transistor for supplying the first external power voltage to the output terminal outputting the internal step-down voltage in response to the output signal from the differential amplifying unit.

11. The circuit according to claim 10, wherein the fifth MOS transistor is a PMOS transistor.

12. The circuit according to claim 10, wherein the sixth MOS transistor is a PMOS transistor.

13. The circuit according to claim 10, wherein the seventh MOS transistor is a PMOS transistor.

* * * * *